United States Patent
Nakanishi

(10) Patent No.: US 11,728,770 B2
(45) Date of Patent: Aug. 15, 2023

(54) SEMICONDUCTOR DEVICE AND OSCILLATION CIRCUIT

(71) Applicant: LAPIS SEMICONDUCTOR CO., LTD., Kanagawa (JP)

(72) Inventor: Koki Nakanishi, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 17/620,494

(22) PCT Filed: Jun. 15, 2020

(86) PCT No.: PCT/JP2020/023367
§ 371 (c)(1),
(2) Date: Dec. 17, 2021

(87) PCT Pub. No.: WO2020/255911
PCT Pub. Date: Dec. 24, 2020

(65) Prior Publication Data
US 2022/0329204 A1  Oct. 13, 2022

(30) Foreign Application Priority Data

Jun. 17, 2019  (JP) .................................. 2019-111929

(51) Int. Cl.
*H03B 5/32*  (2006.01)
*H03K 3/354*  (2006.01)
(Continued)

(52) U.S. Cl.
CPC ............... *H03B 5/32* (2013.01); *H03H 11/04* (2013.01); *H03H 11/1213* (2013.01); *H03K 3/3545* (2013.01); *H03L 1/02* (2013.01)

(58) Field of Classification Search
CPC ...... H03B 5/32; H03H 11/04; H03H 11/1213; H03K 3/3545; H03L 1/02
(Continued)

(56) References Cited

U.S. PATENT DOCUMENTS

| 4,906,948 A * | 3/1990 | Quievy ................ H03K 3/0307 |
| | | 331/158 |
| 7,750,730 B2 | 7/2010 | Irino |

(Continued)

FOREIGN PATENT DOCUMENTS

| JP | S6434003 A | 2/1989 |
| JP | 2002359544 A | 12/2002 |

(Continued)

OTHER PUBLICATIONS

Written Opinion and International Search Report dated Aug. 6, 2020, 4 pgs.

*Primary Examiner* — Arnold M Kinkead
(74) *Attorney, Agent, or Firm* — Volentine, Whitt & Francos, PLLC

(57) ABSTRACT

A semiconductor device including a first inverter circuit connected in parallel to a crystal vibrating element; a second inverter circuit connected to the first inverter circuit so as to share an input therewith, and outputting an oscillation signal; and a wave filter connected to the second inverter circuit and having a passband that is determined in advance and includes an oscillation frequency of the oscillation signal.

5 Claims, 5 Drawing Sheets

(51) Int. Cl.
*H03H 11/04* (2006.01)
*H03L 1/02* (2006.01)
*H03H 11/12* (2006.01)

(58) Field of Classification Search
USPC .................................... 331/158, 116 FE, 74
See application file for complete search history.

(56) References Cited

U.S. PATENT DOCUMENTS

| 8,754,678 | B1 | 6/2014 | Schell | |
|---|---|---|---|---|
| 2001/0006357 | A1* | 7/2001 | Yamamoto | H03K 3/03 |
| | | | | 331/77 |

FOREIGN PATENT DOCUMENTS

| JP | 2005354131 A | 12/2005 |
|---|---|---|
| JP | 2007274649 A | 10/2007 |
| JP | 2008109265 A | 5/2008 |
| JP | 2015092626 A | 5/2015 |

\* cited by examiner

SEMICONDUCTOR DEVICE AND OSCILLATION CIRCUIT

TECHNICAL FIELD

The present disclosure relates to a semiconductor device and an oscillation circuit, and in particular, to a semiconductor device that includes an oscillation circuit that is the source of a clock signal, and the oscillation circuit

BACKGROUND ART

An oscillation circuit that includes a crystal vibrating element and an inverter circuit (hereinafter called "crystal oscillation circuit" upon occasion) is known as an example of an oscillation circuit. Such an oscillation circuit is realized by, for example, a CMOS (Complementary Metal Oxide Semiconductor) type semiconductor integrated circuit, and, in this case, the inverter circuit also uses a CMOS type inverter. In particular, in the field of wireless communication, high accuracy and a high degree of stability are demanded with respect to the reference frequency that is generated by the crystal oscillation circuit.

As an example of an oscillation circuit having the above-described structure, Japanese Patent Application Laid-Open (JP-A) No. 2005-354131 discloses, in a clock generating circuit that is formed from an oscillation circuit, a waveform shaping circuit that is connected to the output side of the oscillation circuit, and an output driving circuit that is connected to the output side of the waveform shaping circuit, a clock generating circuit that has the feature that a Schmitt inverter is disposed at the initial stage of the waveform shaping circuit.

FIG. 5 shows a circuit diagram of a crystal oscillation circuit 50 relating to a comparative example, which drawing selectively illustrates the main portions of the clock generating circuit disclosed in JP-A No. 2005-354131. As shown in FIG. 5, the crystal oscillation circuit 50 is structured to include a crystal vibrating element X1, an inverter circuit 11, a Schmitt trigger circuit 26, capacitors C1, C2 and a resistor R1. Namely, the capacitors C1, C2 are connected between the both ends of the crystal vibrating element X1 and GND (ground, ground regions), and the resistor R1 and the inverter circuit 11 are connected in parallel to the crystal vibrating element X1.

The Schmitt trigger circuit 26 is connected to a node 100 that is the output side node of the inverter circuit 11, and shapes the waveform of the oscillation signal outputted from the inverter circuit 11, and outputs the signal as a clock signal. Namely, the input/output characteristic of the Schmitt trigger circuit 26 has hysteresis, and a relatively high threshold value VtH and a relatively low threshold value VtL exist as input threshold values. Further, the operation point (self bias potential, the potential of the node 100) of the output of the inverter circuit 11 is set so as to be a potential between the threshold values VtH and VtL. Due to this structure, when the potential of the node 100 rises, the potential of node 102 is low (L) output until the threshold value VtH is exceeded, and, when the voltage drops, the potential of the node 102 is high (H) output until falling below the threshold value VtL. By using this characteristic (i.e., a hysteresis characteristic) of the Schmitt trigger circuit 26, the small amplitude bias in the initial state at the time of start-up of the crystal oscillation circuit 50 is eliminated, and a clock of the desired oscillation frequency is outputted from the node 102.

SUMMARY OF INVENTION

Technical Problem

In the structure of the crystal oscillation circuit 50, in order to make small the load that is seen from the node 100 that is the node at the crystal vibrating element X1 output side, the size of the transistor at the input stage of the Schmitt trigger circuit 26 must be set to be small. However, if the size of the transistor at the input stage is made to be small, there are cases in which the phase noise of the clock signal outputted from the node 102 becomes large for reasons such as sensitivity to waveform fluctuations of the clock signal and the like. With regard to this point, the clock generating circuit disclosed in Patent Document 1 also does not handle such a problem.

Based on the above-described circumstances, an object of embodiments of the present invention is to provide a semiconductor device and an oscillation circuit in which phase noise is reduced.

Solution to Problem

A semiconductor device relating to the present disclosure comprises: a first inverter circuit connected in parallel to a crystal vibrating element; a second inverter circuit connected to the first inverter circuit so as to share an input therewith, and output an oscillation signal; and a wave filter connected to the second inverter circuit and having a passband that is determined in advance and includes an oscillation frequency of the oscillation signal.

An oscillation circuit relating to the present disclosure comprises: the above-described semiconductor device; and a crystal vibrating element connected in parallel to the first inverter circuit.

Advantageous Effects of Invention

In accordance with embodiments of the present invention, the excellent effect of being able to provide a semiconductor device and an oscillation circuit in which phase noise is reduced is achieved.

DESCRIPTION OF EMBODIMENTS

Embodiments of the present invention are described in detail hereinafter with reference to FIG. 1 through FIG. 4. In the following embodiments, description is given by using, as an example, a form that is used in a crystal oscillation circuit that is the source of a clock signal in a semiconductor device.

Figure 1:
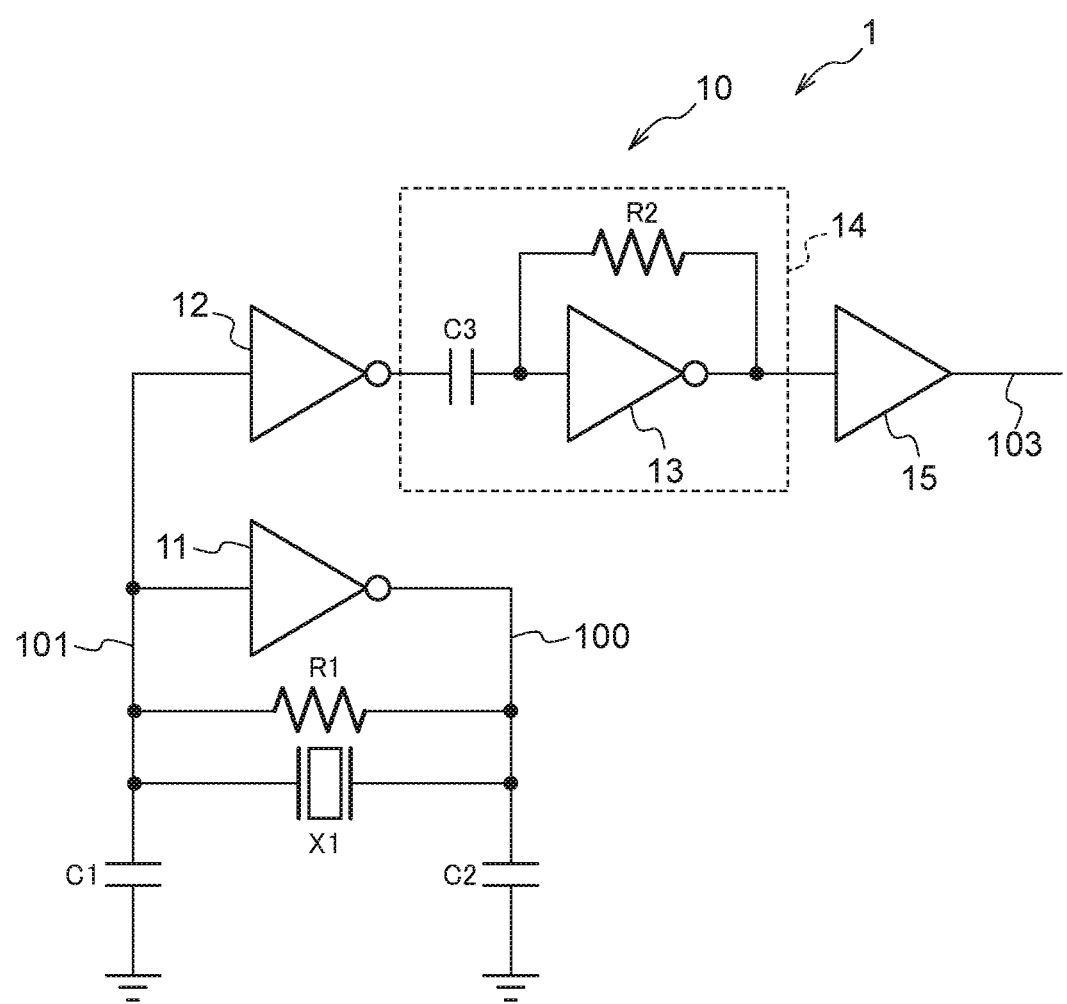
FIG. 1 is a circuit diagram showing an example of the structure of an oscillation circuit relating to embodiments.

FIG. 1 shows an oscillation circuit 1 that serves as a crystal oscillation circuit relating to the present embodiment. As shown in FIG. 1, the oscillation circuit 1 is structured to include a semiconductor device 10 and the crystal vibrating element X1. Further, the semiconductor device 10 is structured to include the inverter circuit 11, the capacitors C1, C2, the resistor R1, an inverter circuit 12, a bandpass filter (bandpass wave filter) 14, and a buffer 15.

Figure 5:
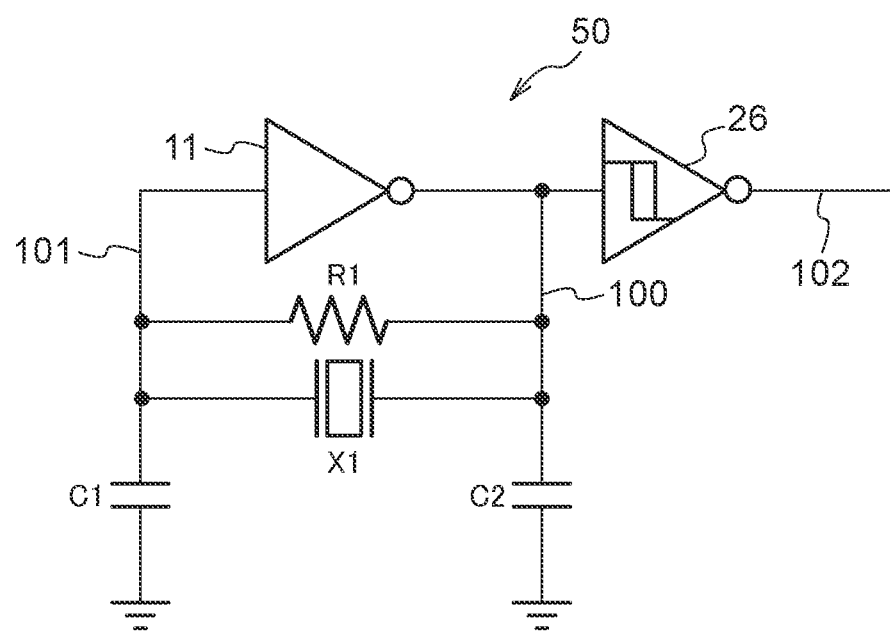
FIG. 5 is a circuit diagram showing the structure of a crystal oscillation circuit relating to a comparative example.

In FIG. 1, the structure that includes the crystal vibrating element X1, the inverter circuit 11, the capacitors C1, C2 and the resistor R1 is a circuit in which the Schmitt trigger circuit 26 is removed from the crystal oscillation circuit 50 shown in FIG. 5, and structures the oscillation section of the oscillation circuit 1. The crystal vibrating element X1 vibrates at a specific frequency due to the piezoelectric effect, when voltage is applied to the electrodes at the both ends thereof. Because the phase is inverted between the two electrodes of the crystal vibrating element X1, the phase differs by 360 at the input and output of the inverter circuit 11, so as to correspond to the inverting at the inverter circuit 11. Due thereto, a positive feedback circuit is structured and oscillates at the oscillation circuit 1. Hereinafter, there are cases in which the oscillation signal that is outputted from node 103 is called the "clock signal".

In the semiconductor device 10, a Schmitt trigger circuit is not used, and the inverter circuit 12 is connected to node 101, i.e., the input of the inverter circuit 11. At the crystal oscillation circuit 50, the Schmitt trigger circuit 26 is connected to the node 100, i.e., the output of the inverter circuit 11, and this point is one point where the crystal oscillation circuit 50 relating to the comparative example and the semiconductor device 10 greatly differ. Note that, in the present embodiment, the gate width ratios of the inverter circuit 11 and the inverter circuit 12 are substantially the same, and this point is described later.

The bandpass filter 14 is structured to include an inverter circuit 13, a capacitor C3 and a resistor R2. The capacitor C3 is connected in series to the output of the inverter circuit 12. The parallel circuit of the inverter circuit 13 and the resistor R2 is connected to the capacitor C3.

Figure 2:
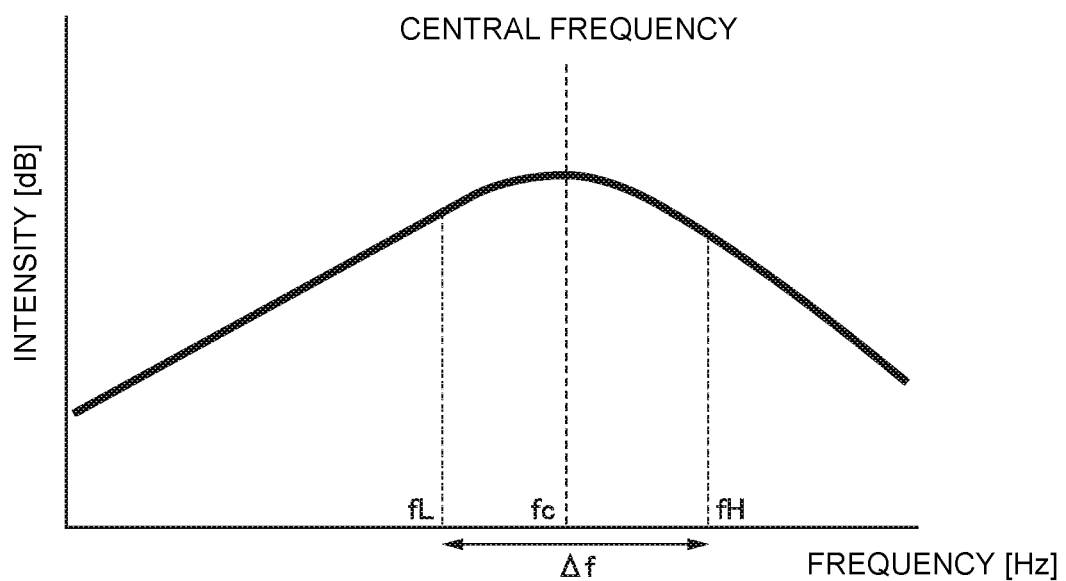
FIG. 2 is a drawing that explains a characteristic of a bandpass filter of a semiconductor device relating to the embodiments.

A bandpass filter is a filter that passes a range of frequencies that are determined in advance and that are centered around a given, specific frequency, and is also called a bandpass wave filter. FIG. 2 shows an example of the characteristic of the bandpass filter 14. As shown in FIG. 2, a central frequency fc, a cut-off frequency fL at the low band side, and a cut-off frequency fH at the high band side exist at the bandpass filter, and the difference between the cut-off frequencies fH and fL is passband Δf. Among these, the central frequency fc is determined in accordance with the vibration frequency of the crystal vibrating element X1, and usually, the central frequency fc is made to match the desired frequency of the clock signal.

Note that the present embodiment describes, as an example, the bandpass filter 14 in which the capacitance value of the capacitor C3 and the resistance value of the resistor R2 are fixed, and that has a fixed characteristic. However, the bandpass filter 14 is not limited to this, and may be the bandpass filter 14 at which at least one of the capacitance value of the capacitor C3 and the resistance value of the resistor R2 is made to be variable, and that has a variable characteristic. If the capacitance value of the capacitor C3 or the resistance value of the resistor R2 is varied, the cut-off frequencies fH, fL vary, and the passband Δf can be changed. By making the capacitance value of the capacitor C3 or the resistance value of the resistor R2 variable, correspondence with the crystal vibrating elements X1 of plural frequencies also is possible.

The buffer 15 is an output buffer of the signal outputted from the bandpass filter 14, and, as needed, may also have the function of converting the output of the bandpass filter 14 into a rectangular wave (limiting). Further, the buffer 15 is not a requisite structure, and may be omitted in consideration of the waveform, the output amplitude, and the like of the bandpass filter 14.

Operation of the oscillation circuit 1 is described next. When power is supplied to the oscillation circuit 1, the (weak) signal of the noise level is gradually amplified by the inverter circuit 11 and the resistor R1 that is a feedback resistor. In this initial state at the time of start-up, the signal amplitude of the node 101 is small as compared with the signal amplitude of the node 100. However, in the oscillation circuit 1 relating to the present embodiment, as described above, the gate width ratio of the inverter circuit 11 and the gate width ratio of the inverter circuit 12 are substantially the same, and therefore, even if the oscillation signal at the node 101 is a signal of a relatively small amplitude, the signal is propagated efficiently to the bandpass filter 14.

Figure 3A:
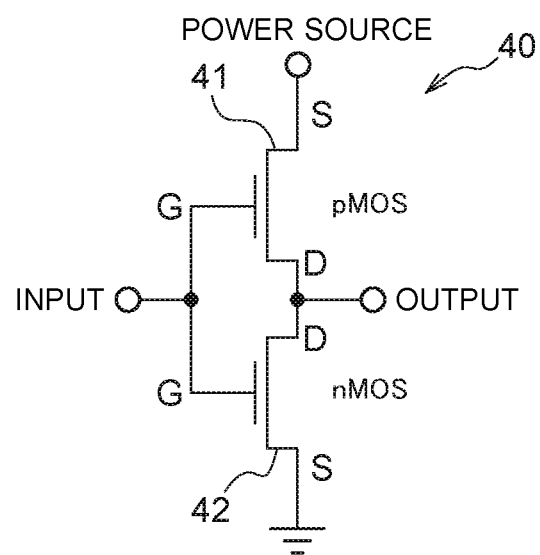
FIG. 3A is a circuit diagram of an inverter circuit relating to the embodiments.
Figure 3B:
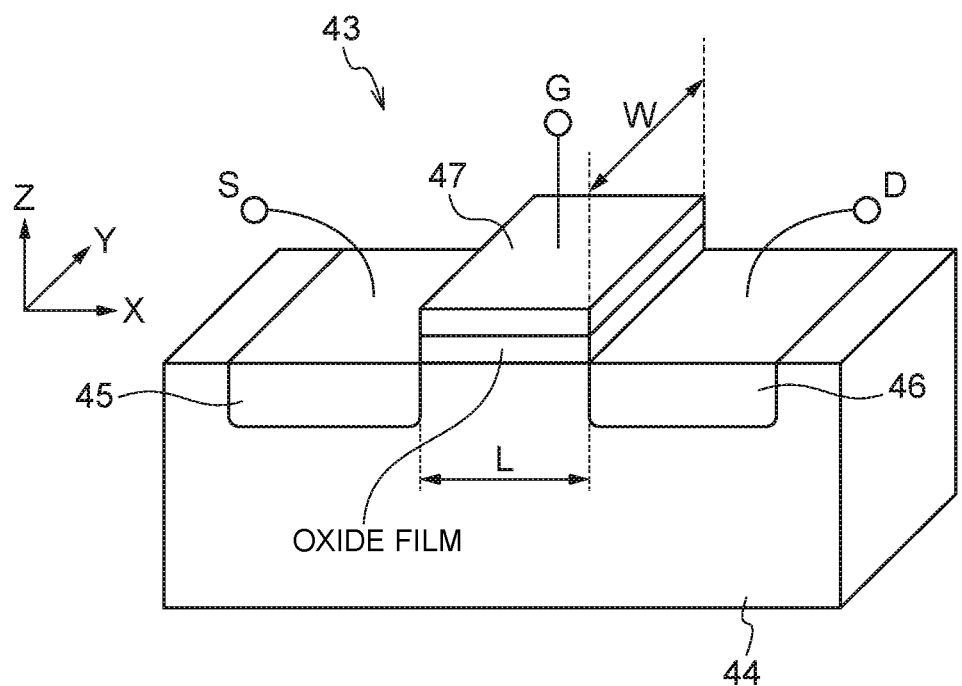
FIG. 3B is a perspective view of a MOSFET relating to the embodiments.

The above-described point is described in further detail with reference to FIG. 3A and FIG. 3B. FIG. 3A shows a circuit diagram of an inverter circuit 40, and FIG. 3B shows a perspective view of a MOSFET (Field Effect Transistor) 43. As shown in FIG. 3A, the inverter circuit 40 is structured to include a P-channel (-type) MOSFET 41 and an N-channel (-type) MOSFET 42. The source of the P-type MOSFET 41 is connected to the power supply, and the source of the N-type MOSFET 42 is connected to GND (ground). Further, the input signal is inputted to a common gate (G), and the output signal is outputted from a common drain (D).

As shown in FIG. 3B, the MOSFET 43 is structured such that a gate electrode 47 that is formed on an oxide film is disposed between impurity regions 45, 46 that are formed on a semiconductor substrate 44. At the P-type MOSFET 41, the conductive type of the impurity regions 45, 46 is P-type, and, at the N-type MOSFET 42, the conductive type of the impurity regions 45, 46 is N-type. At the MOSFET 43 shown in FIG. 3B, the length of the gate electrode 47 in the X-axis direction is called "gate length L", and the length in the Y-axis direction is called "gate width W".

Figure 4:
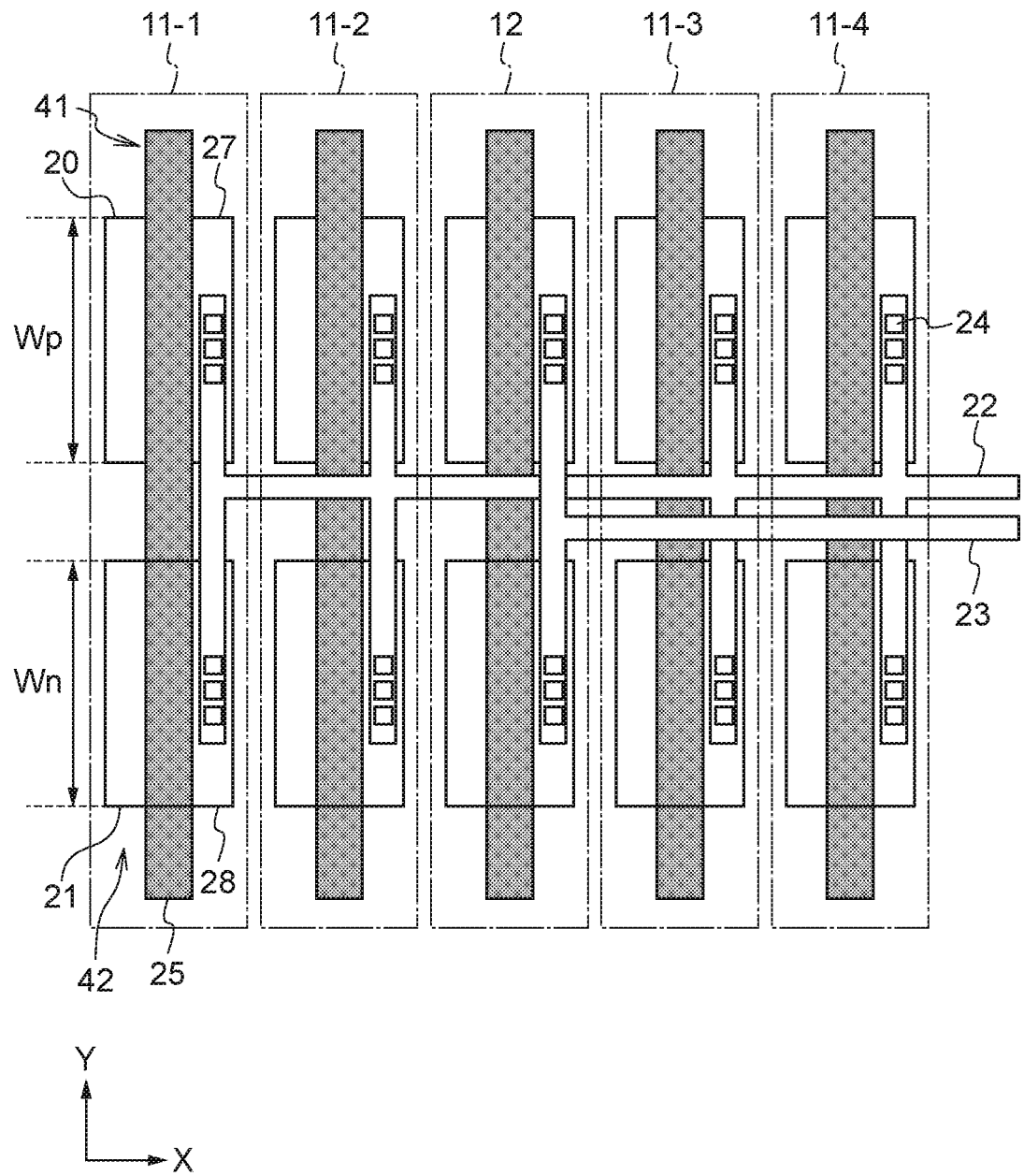
FIG. 4 is a drawing showing the layout of the inverter circuit in the semiconductor device relating to the embodiments.

In the present embodiment, ratio Wp/Wn of gate width Wp of the P-type MOSFET 41 to gate width Wn of the N-type MOSFET 42 at the inverter circuit 40 that is a CMOS is defined as the "gate width ratio" (see FIG. 4). Further, in the present embodiment, the gate width ratio of the inverter circuit 11 and the gate width ratio of the inverter circuit 12 are made to be substantially the same. Due thereto, the threshold value of the input of the inverter circuit 11 and the threshold value of the input of the inverter circuit 12 are substantially the same, and the threshold values of the both inputs work similarly (track) with respect to variations in the external environment such as the temperature, power supply and the like. Therefore, the output amplitude of the inverter circuit 11 and the output amplitude of the inverter circuit 12 are substantially the same. Namely, even if the oscillation signal at the node 101 is a signal of a relatively small amplitude, the oscillation signal is propagated efficiently to the bandpass filter 14. Note that, in the present embodiment, "substantially the same" includes not only cases of exactly matching, but also cases in which the difference between the both is in an allowable range of an extent that is not problematic in actuality.

In the oscillation circuit 1 (the semiconductor device 10) having the above-described structure, noise of high frequency components at the time of start-up is cut (blocked) by the bandpass filter 14, and the signal from which noise has been cut is outputted from the node 103 via the buffer 15. Namely, in accordance with the present embodiment, by providing the bandpass filter 14 as the output stage of the clock signal instead of the Schmitt trigger circuit 26 in the crystal oscillation circuit 50 relating to the comparative example, because of the bandpass characteristic thereof, outputting of an unanticipated clock signal that is due to noise at the time of start-up at the oscillation circuit 1 (the semiconductor device 10) can be prevented. Namely, a signal that is offset from the central frequency fc at the time of start-up can be eliminated. Due thereto, phase noise can be reduced, as compared with the crystal oscillation circuit 50.

Further, generally, a larger transistor size of the input stage of the inverter circuit that is connected to the output stage can reduce phase noise, and, because the inverter circuit 12 of the oscillation circuit 1 (the semiconductor device 10) is connected to the input of the inverter circuit 11, the transistor size of the input stage can be made to be large. Moreover, the transistor size of the MOSFET of the input stage of the inverter circuit 13 also can be set to be large. From this standpoint as well, the oscillation circuit 1 (the semiconductor device 10) relating to the present embodiment is a structure that can effectively reduce phase noise.

Moreover, as described above, in accordance with the oscillation circuit 1 (the semiconductor device 10) relating to the present embodiment, by making the gate width ratio of the inverter circuit 11 and the gate width ratio of the inverter circuit 12 be substantially the same, the input threshold value of the inverter circuit 11 and the input threshold value of the inverter circuit 12 can respectively carry out tracking operation (can follow one another). Due thereto, as compared with the crystal oscillation circuit 50 relating to the comparative example, the oscillation circuit 1 (the semiconductor device 10) is resistant to manufacturing dispersion of elements, and further, can be operated stably even at low voltages.

Further, the crystal oscillation circuit 50 relating to the comparative example has the following problems. Namely, there is the problem that the input threshold value of the Schmitt trigger circuit 26 that determines the hysteresis characteristic affects the clock signal duty ratio that is outputted from the inverter circuit 11, and moreover, the problem that it is easy for the output clock to be affected by dispersion in elements and voltage fluctuations. The oscillation circuit 1 (the semiconductor device 10) relating to the present embodiment solves such problems as well by avoiding use of a Schmitt trigger circuit.

A structure that further improves the accuracy of the above-described tracking operation by contriving the layout of the inverter circuits 11, 12 is described next with reference to FIG. 4. FIG. 4 illustrates an example in which four inverter circuits that are inverter circuits 11-1, 11-2, 11-3, 11-4 are used as the inverter circuit 11. Of course, the inverter circuit 12 also may be structured by using plural inverter circuits. In the present embodiment, the reason why the inverter circuit is structured from plural inverter circuits is in order to use an inverter circuit of a predetermined size as the unit inverter circuit, and make it such that the number of inverter circuits that are used can be adjusted in accordance with the magnitude of the current that flows (the driving capability) and the like.

As shown in FIG. 4, the plural inverter circuits 11-1 through 11-4 are disposed so as to be lined-up in a predetermined direction, and the inverter circuit 12 is disposed therebetween. Each of the inverter circuits 11-1 through 11-4. 12 have the P-type MOSFET 41 and the N-type MOSFET 42. At the P-type MOSFET 41, a gate electrode 25 is disposed between a source 20 and a drain 27, and, at the N-type MOSFET 42, the gate electrode 25 is disposed between a source 21 and a drain 28. Further, each of the inverter circuits 11-1 through 11-4. 12 structures the aforementioned unit inverter, and is the same size. Note that the coordinate axis shown in FIG. 4 corresponds to the coordinate axis shown in FIG. 3B. On the other hand, the drains 27 and the drains 28 of the inverter circuits 11-1 through 11-4 are connected to a drain line 22 via contacts 24, and the drain 27 and the drain 28 of the inverter circuit 12 are connected to a drain line 23 via the contacts 24.

In FIG. 4, the length of the source 20 (the drain 27) in the Y-axis direction is the gate width Wp of the P-type MOSFET 41, and the length of the source 21 (the drain 28) in the Y-axis direction is the gate width Wn of the N-type MOSFET 42. As described above, in the present embodiment, there is a layout in which the gate width ratio Wp/Wn of the inverter circuit 11 and the gate width ratio Wp/Wn of the inverter circuit 12 are substantially the same. Note that, in FIG. 4, the length of the gate electrode 25 in the X-axis direction is the gate length.

At this time, by disposing the inverter circuit 12 between the plural inverter circuits 11-1 through 11-4, at the time of the etching step in the manufacturing process, it is difficult for the inverter circuit 12 to be affected by the pattern at the periphery (the inverter circuit 12 is protected from excessive etching by the peripheral pattern), and therefore, dispersion in the elements of the inverter circuit 12 can be suppressed. Due thereto, the gate width ratio of the inverter circuits 11 and the gate width ratio of the inverter circuit 12 can be made to coincide more precisely. Note that, in FIG. 4, description is given by using, as an example, a form in which the inverter circuit 12 is disposed in the center of the four inverter circuits 11-1 through 11-4. However, the oscillation circuit 1 (the semiconductor device 10) is not limited to this, and, provided that there is a structure in which the inverter circuit 12 is sandwiched between two inverter circuits 11, the inverter circuit 12 may be disposed between other inverter circuits 11.

Note that the above-described embodiment describes, as an example, a form in which the bandpass filter 14 that has a one-stage structure is used, but the present disclosure is not limited to this, and there may be a form in which the bandpass filters 14 are connected in series in plural stages. In accordance with this form, the frequency selectivity can be improved more.

Further, the above-described embodiment describes, as an example, a form in which the bandpass filter 14 is used as the circuit that is connected to the stage after the inverter circuit 12, but the present disclosure is not limited to this. Provided that there is a filter circuit that damps frequencies other than the desired frequency such as a notch filter or the like, any filter circuit can be used without limitations. Effects that are similar to those of the semiconductor device 10 relating to the present embodiment can be achieved by such filter circuits as well.

The disclosure of Japanese Patent Application No. 2019-111929 filed on Jun. 17, 2019 is, in its entirety, incorporated by reference into the present specification.

All publications, patent applications, and technical standards mentioned in the present specification are incorporated by reference into the present specification to the same extent as if such individual publication, patent application, or technical standard was specifically and individually indicated to be incorporated by reference.

The invention claimed is:

1. A semiconductor device, comprising:
   a first inverter circuit connected in parallel to a crystal vibrating element;
   a second inverter circuit connected to the first inverter circuit so as to share an input therewith, and output an oscillation signal; and
   a wave filter connected to the second inverter circuit and having a passband that is determined in advance and includes an oscillation frequency of the oscillation signal,
   wherein the wave filter is configured by a plurality of wave filters that are connected in series, and
   the wave filter is a bandpass filter having a third inverter circuit, a capacitor connected in series to an input of the third inverter circuit, and a resistor connected between the input and an output of the third inverter circuit.

2. The semiconductor device of claim 1, wherein a gate width ratio, which is a ratio of a gate width of a P-type field effect transistor to a gate width of an N-type field effect transistor, at the first inverter circuit and a gate width ratio of the second inverter circuit are substantially the same.

3. The semiconductor device of claim 1, wherein at least one of a capacitance value of the capacitor or a resistance value of the resistor is variable.

4. The semiconductor device of claim 1, wherein the second inverter circuit is disposed between a plurality of the first inverter circuits, as seen in a plan view.

5. An oscillation circuit, comprising:
   the semiconductor device of claim 1; and
   the crystal vibrating element connected in parallel to the first inverter circuit.

* * * * *